(12) United States Patent
Hirako (10) Patent No.: US 9,063,195 B2
(45) Date of Patent: Jun. 23, 2015

(54) INSPECTING JIG

(75) Inventor: Ryoichi Hirako, Tokyo (JP)

(73) Assignee: YOKOWO CO., LTD., Tokyo (JP)

( * ) Notice: Subject to any disclaimer, the term of this patent is extended or adjusted under 35 U.S.C. 154(b) by 659 days.

(21) Appl. No.: 13/225,805

(22) Filed: Sep. 6, 2011

(65) Prior Publication Data

US 2012/0119772 A1    May 17, 2012

(30) Foreign Application Priority Data

Sep. 7, 2010  (JP) .................................. 2010-199503

(51) Int. Cl.
G01R 31/00 (2006.01)
G01R 31/28 (2006.01)
G01R 31/04 (2006.01)

(52) U.S. Cl.
CPC .......... *G01R 31/2808* (2013.01); *G01R 31/043* (2013.01)

(58) Field of Classification Search
CPC ............... G01R 31/043; G01R 31/046–31/048
USPC ............. 324/750.16, 750.22, 750.25, 754.11, 324/750.26, 538, 756.01
See application file for complete search history.

(56) References Cited

U.S. PATENT DOCUMENTS

| | | | | |
|---|---|---|---|---|
| 4,225,819 A * | 9/1980 | Grau et al. | ..................... | 324/415 |
| 4,232,262 A * | 11/1980 | Emo et al. | ...................... | 324/722 |
| 4,978,912 A * | 12/1990 | Vonder et al. | ............ | 324/754.08 |
| 5,283,605 A * | 2/1994 | Lang-Dahlke | ........... | 324/763.01 |
| 5,572,144 A * | 11/1996 | Davidson et al. | ........ | 324/750.19 |
| 5,627,473 A * | 5/1997 | Takani | ........................... | 324/538 |
| 6,064,195 A * | 5/2000 | Clayton et al. | ............ | 324/750.16 |
| 6,116,935 A * | 9/2000 | Fukuda | ......................... | 439/310 |
| 6,316,951 B1* | 11/2001 | Chiyoda | ................... | 324/754.14 |
| 6,751,856 B2* | 6/2004 | Kedrowski et al. | ............. | 29/832 |
| 7,656,179 B2* | 2/2010 | Suzuki et al. | ............ | 324/754.08 |
| 2001/0007425 A1* | 7/2001 | Yoshida | ........................ | 324/538 |

(Continued)

FOREIGN PATENT DOCUMENTS

| | | |
|---|---|---|
| CN | 1816751 A | 8/2006 |
| JP | 2005-283218 | 10/2005 |

(Continued)

OTHER PUBLICATIONS

Notification of First Office Action dated Dec. 1, 2014, for Chinese patent application No. 201110271359.9.

*Primary Examiner* — Patrick Assouad
*Assistant Examiner* — Demetrius Pretlow
(74) *Attorney, Agent, or Firm* — Morgan, Lewis & Bockius LLP (57) ABSTRACT

Inspecting jig operable to bring a probe into contact with a connector on a board includes a probe holding body; a guide guiding the probe to be in contact with the connector on the board, the guide being engaged with the connector to be positioned with respect to the connector; and a coupling unit coupling the probe holding body and the guide to move relative to each other between a first relative position and a second relative position, the first relative position where a distal end of the probe is brought into contact with the connector when the guide is positioned with respect to the connector, the second relative position where the distal end of the probe is separated from the board and is separated from an imaginary line perpendicular to the board and passing the connector, when the guide is positioned with respect to the connector.

9 Claims, 12 Drawing Sheets

(56) References Cited

U.S. PATENT DOCUMENTS

| | | |
|---|---|---|
| 2001/0013782 A1* | 8/2001 | Nagano et al. ............... 324/538 |
| 2005/0017708 A1 | 1/2005 | Miller et al. |
| 2008/0113527 A1 | 5/2008 | Suzuki et al. |
| 2008/0129321 A1 | 6/2008 | Suzuki et al. |
| 2009/0212806 A1* | 8/2009 | Schmegner et al. .......... 324/761 |
| 2010/0283478 A1* | 11/2010 | Katoh .......................... 324/538 |

FOREIGN PATENT DOCUMENTS

| | | |
|---|---|---|
| JP | 2008-140770 | 6/2008 |
| WO | WO 2009060948 A1 * | 5/2009 |

* cited by examiner

INSPECTING JIG

BACKGROUND OF THE INVENTION

The present invention relates to an inspecting jig for connecting a connector on a board of a device such as a mobile phone, to an inspecting apparatus by way of a probe.

In a small electronic apparatus such as a mobile phone, a digital camera, it has been conducted that a plurality of boards are disposed in a stacked manner, for the purpose of mounting a number of electronic circuits in a small space, and the boards are electrically connected by coupling connectors which are respectively provided on the boards. In order to inspect the boards and the connectors disposed thereon, it is necessary to electrically connect an inspecting apparatus to the connectors.

Figure 11:
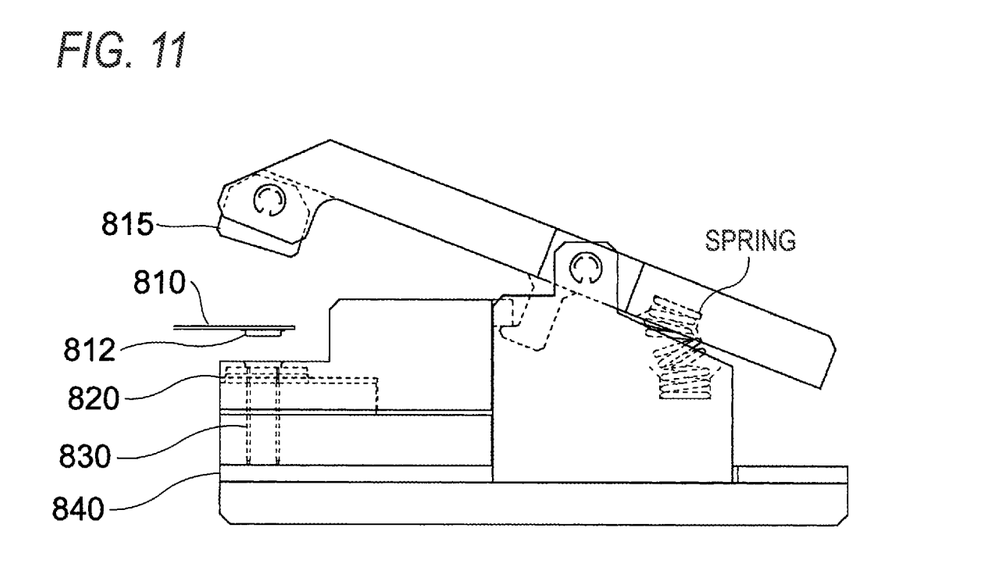
FIG. 11 is a side view of a relay connector in Related Art 1, when probes are not in contact with a connector.
Figure 12:
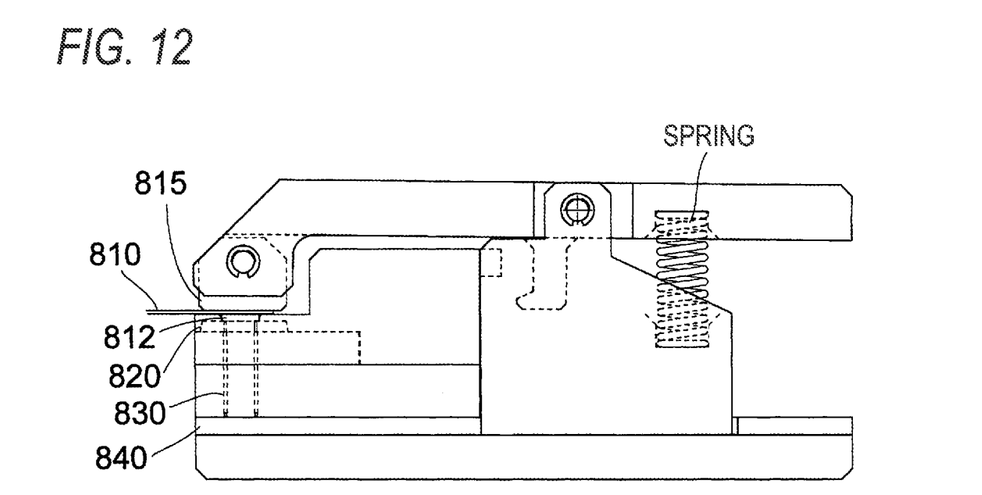
FIG. 12 is a side view of the relay connector in Related Art 1, when the probes are in contact with the connector.
Figure 13:
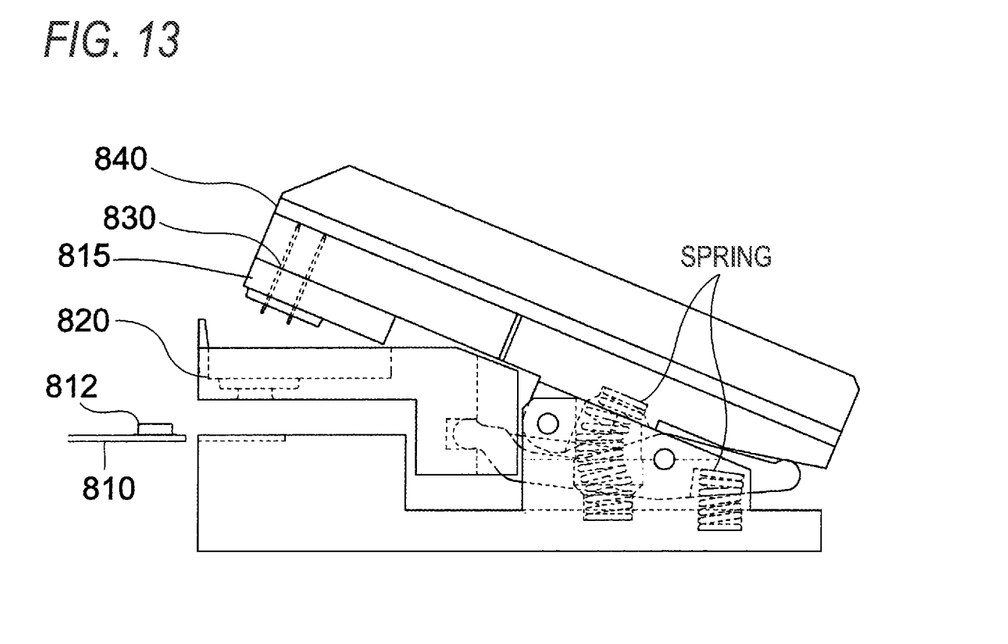
FIG. 13 is a side view of a relay connector in Related Art 2, when probes are not in contact with a connector.
Figure 14:
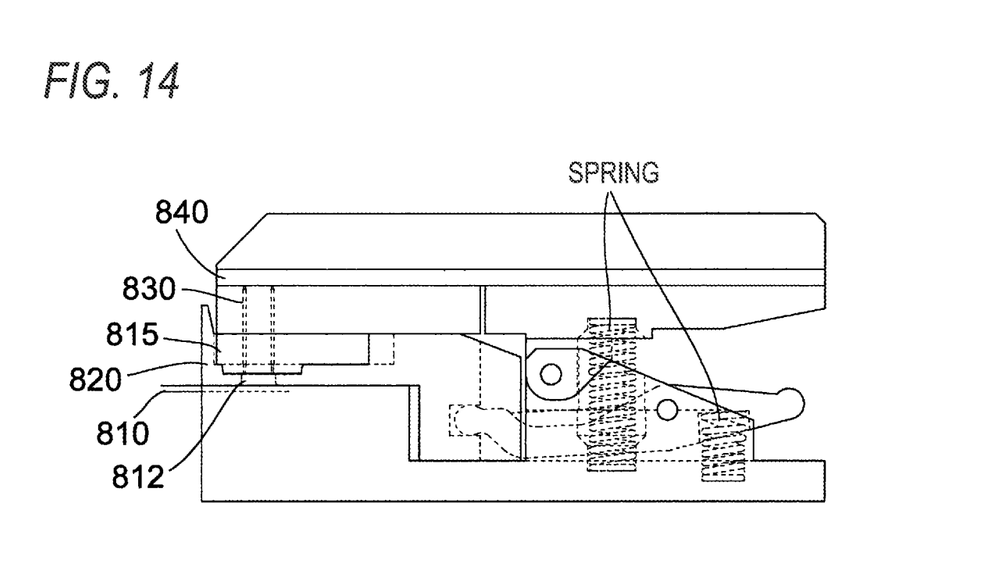
FIG. 14 is a side view of the relay connector Related Art 2, when the probes are in contact with the connector.
Figure 15:
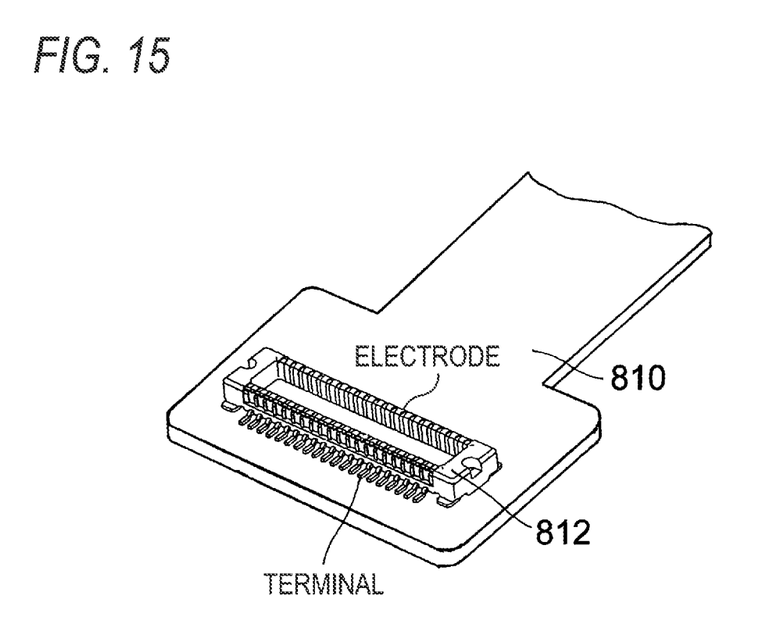
FIG. 15 is a perspective view for exemplifying the connector to be inspected.

The applicant has already proposed a relay connector for electrically connecting a connector to an inspecting apparatus, in JP-A-2008-140770. This relay connector has such a structure, as shown in FIGS. 11 and 12 (Related Art 1), that probes 830 are brought into contact with a connector 812, by clamping a board 810 and the connector 812 between a pressure block 815 and a guide 820. The connector 812 is electrically connected to the inspecting apparatus (not shown) by way of the probes 830 and a wiring pattern (not shown) of a wiring board 840, and thus, the inspection is carried out. FIGS. 13 and 14 (Related Art 2) show an example where the probes 830 and the wiring board 840 are held at a side of the pressure block 815. FIG. 15 is a perspective view for exemplifying the connector 812 to be inspected.

JP-A-2005-283218 discloses a connector inspecting jig for electrically connecting a connector to an inspecting apparatus. This connector inspecting jig is different from the relay connector disclosed in JP-A-2008-140770, and so constructed that the probes are pressed against the connector from above of the board to be contacted with each other, without clamping the board and the connector.

The relay connector disclosed in JP-A-2008-140770 is so constructed that the board and the connector are clamped. Therefore, there is a problem that although the relay connector favorably works, in case where the connector is in an end part of the board, it is difficult or impossible to bring the probes into contact with the connector, in case where the connector is in a center part of the board. On the other hand, in the connector inspecting jig in JP-A-2005-283218, the probes can be brought into contact with the connector, even in case where the connector is in the center part of the board, because it is so constructed that the probes are pressed against the connector from the above of the board, without clamping the board and connector. However, in the connector inspecting jig in JP-A-2005-283218, there is a problem in visual observation of an inspector, because the connector and its surroundings are covered with a guide plate, the probes and a probe holding body, when the probes are positioned with respect to the connector.

SUMMARY

It is therefore an object of the invention to provide an inspecting jig in which a probe can be brought into contact with a connector, even in case where the connector is in a center part of a board, and favorable visual observation of an inspector can be attained, when the probe is positioned with respect to the connector.

In order to achieve the object, according to the invention, there is provided an inspecting jig operable to bring a probe into contact with a connector on a board, the inspecting jig comprising: a probe holding body holding the probe; a guide guiding the probe to be brought into contact with the connector on the board, the guide being engaged with the connector thereby to be positioned with respect to the connector; and a coupling unit coupling the probe holding body and the guide so as to relatively move with respect to each other, between a first relative position and a second relative position, the first relative portion where a distal end of the probe is brought into contact with the connector when the guide is positioned with respect to the connector, the second relative position where the distal end of the probe is separated from the board and is separated from an imaginary line, which is perpendicular to the board and passes the connector, when the guide is positioned with respect to the connector.

The connector can be visually observed, when the probe holding body and the guide are at least in the second relative position.

The coupling unit may linearly couple the probe holding body and the guide so as to relatively move with respect to each other, between the first relative position and a third relative position where the distal end of the probe is separated from the board and the probe is in parallel with the imaginary line when the guide is positioned with respect to the connector.

The guide may include a leg part which is erected toward the board, in such a manner that a side face of a lower end part of the leg part is butted against a side face of the connector, and a lower end of the leg part functions as a butting part to be butted against the board, in a state where the guide is positioned with respect to the connector.

The guide may include a bottom face part, and first and second side wall parts which are erected from both sides of the bottom face parts to an opposite side to the board and which are opposed to each other, the first and second side wall parts may be erected from right and left sides of the bottom face part, whereas a front side may be open without a side wall part, and the connector can be visually observed from the front side through an opening in the bottom face part, when the probe holding body and the guide are in the second relative position.

The inspecting jig may further include a spring provided between the probe holding body and the guide and urging the probe holding body and the guide to the second relative position.

The coupling unit may include a guide groove or a guide slit provided in one of the probe holding body and the guide, and a boss or a rod member provided in the other of the probe holding body and the guide, and the boss or the rod member may be engaged with the guide groove or the guide slit to relatively move along the guide groove or the guide slit, thereby enabling the probe holding body and the guide to relatively move between the first relative position and the second relative position.

The guide may include a bottom face part, a leg part which is erected from a peripheral edge of an opening in the bottom face part, and first and second side wall parts, which are erected from the bottom face part at both sides of a position where the leg part is erected, to an opposite side to the leg part, to be opposed to each other, the probe holding body may be positioned between the first and second side wall parts, and include first and second opposed faces to be opposed to the first and second side wall parts, the coupling unit may include a guide groove or a guide slit provided in one pair of the first and second opposed faces and the first and second side wall parts, and a boss or a rod member provided in the other pair of the first and second opposed faces and the first and second side wall parts, the boss or the rod member may be engaged with the guide groove or the guide slit to relatively move along the guide groove or the guide slit, thereby enabling the probe holding body and the guide to relatively move between the first relative position and the second relative position, and in a state where the guide is positioned with respect to the connector, a side face of a distal end part of the leg part may be butted against a side face of the connector, and a distal end of the leg part may be butted against the board.

The leg part may have a tubular shape, and an inner side face of the leg part may be butted against the side face of the connector.

The guide may be butted against the board only at the distal end of the leg part thereof.

It is to be noted that desired combinations of the above described constituent elements, and descriptions of the invention which are exchanged between methods and systems also effectively function as features of the invention.

DETAILED DESCRIPTION OF EMBODIMENTS

Now, preferred embodiments of the invention will be described in detail, referring to the drawings. It is to be noted that same reference numerals are given to the same or equivalent constituent elements, members, and so on which are shown in the drawings, and overlapped descriptions are appropriately omitted. Moreover, the embodiments do not limit the invention, but only exemplify the invention, and all the features described in the embodiments and combinations of the features are not absolutely essential to the invention.

First Embodiment

Figures 1A, 1B:
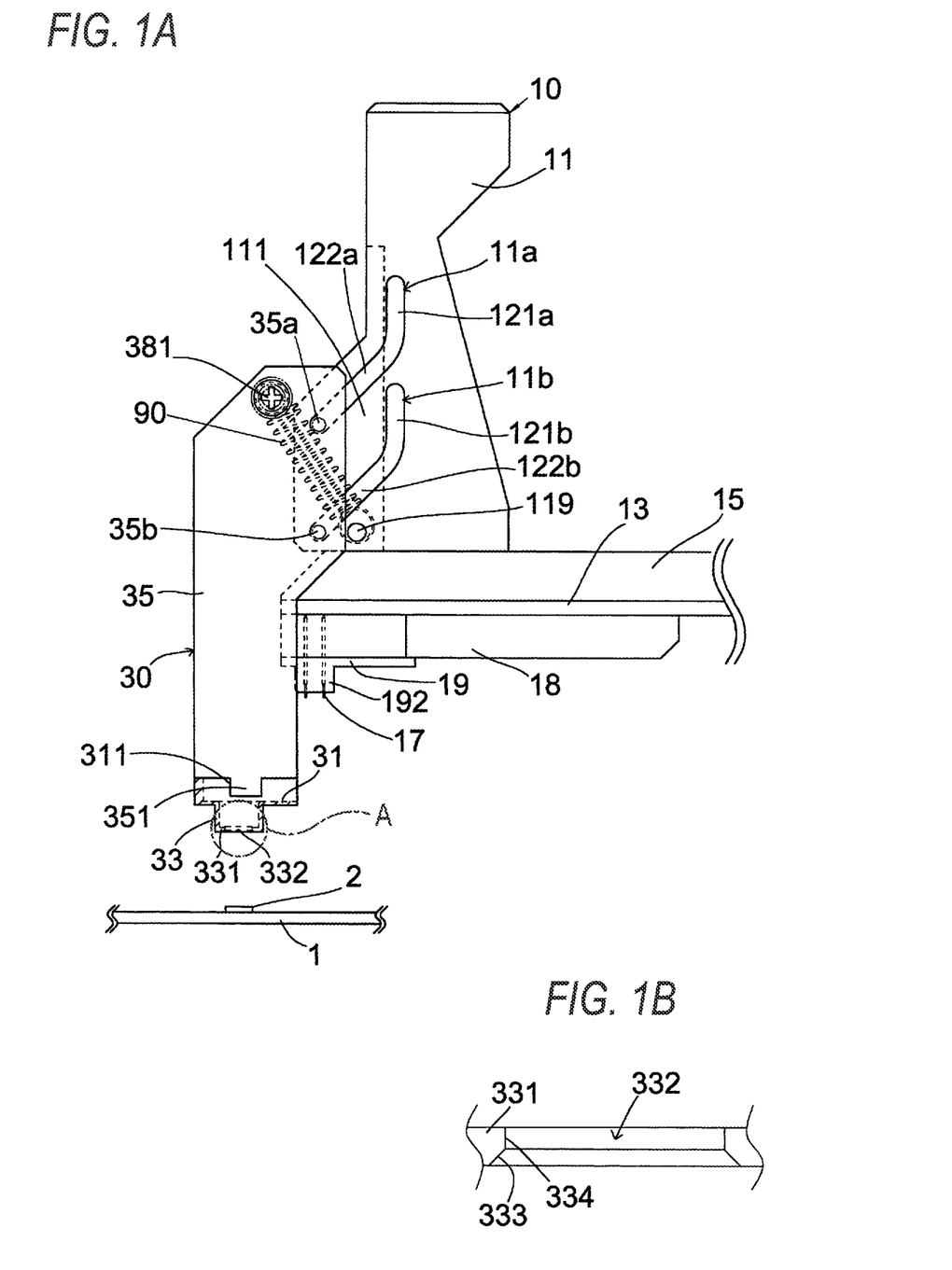
FIG. 1A is a side view of an inspecting jig in a first embodiment according to the invention.
FIG. 1B is a partial enlarged view of a portion indicated by A shown in FIG. 1A.
Figure 2:
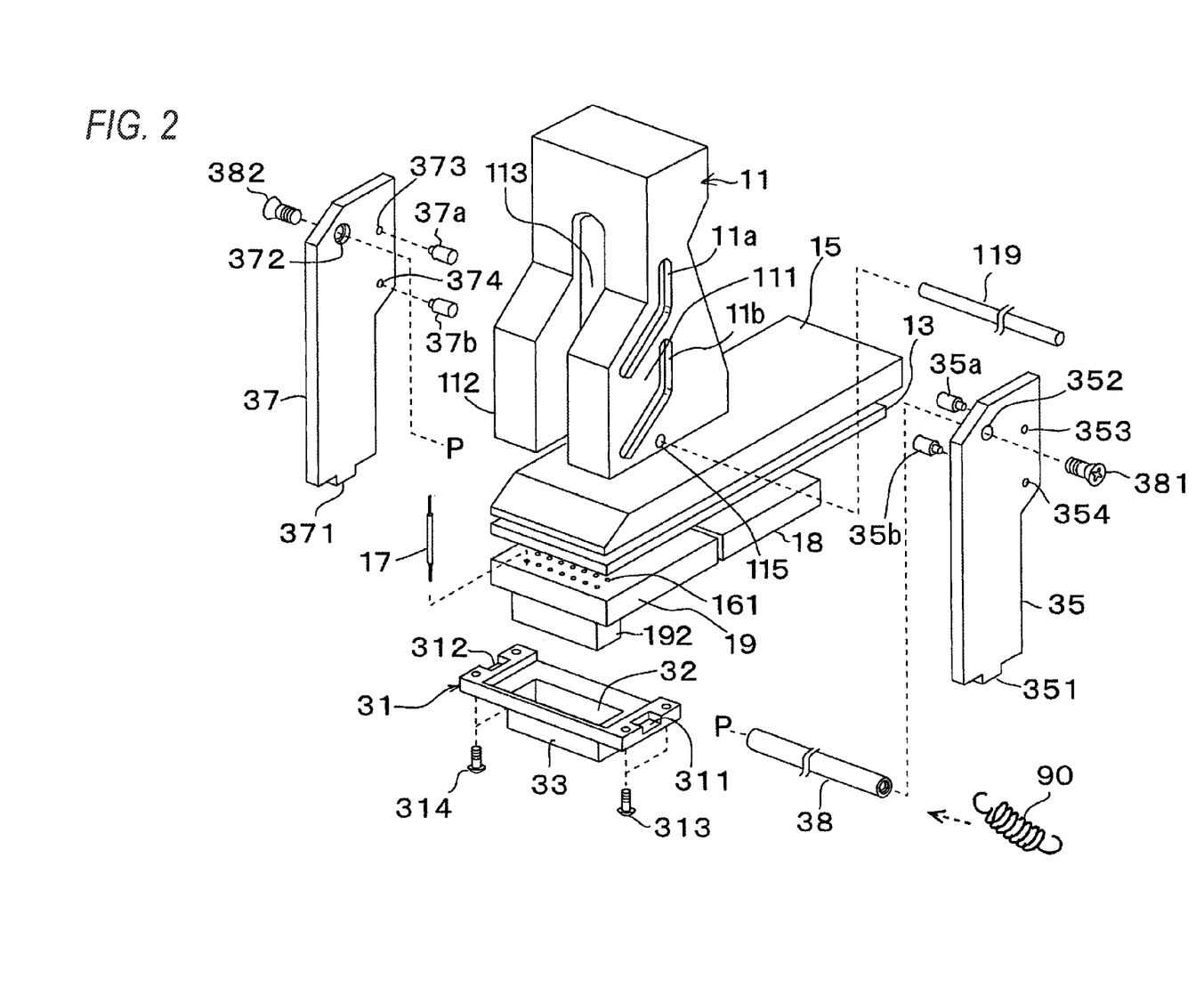
FIG. 2 is an exploded perspective view of the inspecting jig in the first embodiment.

FIG. 1 is a side view of an inspecting jig in a first embodiment according to the invention. FIG. 1B is a partial enlarged view of a portion indicated by A shown in FIG. 1A. FIG. 2 is an exploded perspective view of the inspecting jig. This inspecting jig is used for conducting an inspection by bringing probes 17 into contact with a connector 2 to be inspected which is provided on a board 1, as shown in FIG. 1A (A number of electrodes are disposed on the connector 2 (See FIG. 15), with which the probes 17 are to be contacted). The inspecting jig includes a probe holding body 10, a guide 30, and a spring 90.

The probe holding body 10 formed of insulating resin, for example, has a sliding member 11, an on-board cover 15, an under-board cover 18, and a pin block 19. The sliding member 11 has a laterally symmetrical shape. As shown in FIG. 2, the sliding member 11 has a first sliding part 111 which is opposed to (or contacted with) a first side wall part 35, which will be described below, thereby to slide relative to each other, and a second sliding part 112 which is opposed to (or contacted with) a second side wall part 37, which will be described below, thereby to slide relative to each other. The first and second sliding parts 111, 112 are integrally formed so that a space 113 is formed between them. The space 113 functions as a movable space of the spring 90, as described below.

The first sliding part 111 is provided with guide grooves 11a, 11b having a mutually same shape, on a right side face thereof (the face opposed to the first side wall part 35). The guide groove 11b is in such a positional relation with respect to the guide groove 11a that the guide groove 11a is displaced in parallel, on the right side face of the first sliding part 111. The second sliding part 112 is also provided with guide grooves having a mutually same shape (the same shape as the guide grooves 11a, 11b, although not shown in the drawings), on a left side face thereof (the face opposed to the second side wall part 37). These guide grooves constitute a coupling unit for coupling the probe holding body 10 and the guide 30, in combination with bosses 35a, 35b, 37a, 37b which will be described below.

The first sliding part 111 has a through hole 115. The second sliding part 112 has a through hole (not shown in the drawings) in the same manner. Both ends of a rod member 119 formed of metal such as aluminum, for example, are respectively inserted into these through holes (both the ends do not protrude outside), so as to bridge the first and the second sliding parts 111, 112 through the space 113. One end of the spring 90 is attached to (hooked on) the rod member 119.

The on-board cover 15 is fixed to a bottom face of the sliding member 11 with screws or the like. A wiring board 13 is fixed to the on-board cover 15 with screws or the like. An upper face of the wiring board 13 is covered with the on-board cover 15. A wiring pattern for connecting the probes 17 to an inspecting apparatus (not shown) is formed on the wiring board 13. An under-board cover 18 is fixed to the on-board cover 15 with screws or the like, at a position covering a part of a lower face of the wiring board 13, in other words, at a position clamping the wiring board 13 between the on-board cover 15 and the under-board cover 18 itself.

The pin block 19 is fixed to the on-board cover 15 with screws or the like, at a position clamping the wiring board 13 between the on-board cover 15 and the pin block 19 itself. The pin block 19 may be integrally formed with the under-board cover 18, or may be separately formed. The probes 17 of a determined number are respectively inserted into through holes 161 in the pin block 19 to be held therein, and distal ends of the probes 17 are projected downward from the through holes 161 by a determined length. The probes 17 are preferably urged by springs (not shown) which are respectively incorporated therein, for example, in such a manner that the distal ends can be contracted so as to be withdrawn into the through holes 161, but the distal ends remain protruded from the through hole 161 by a determined length.

As shown in FIG. 2, the guide 30 which is formed of insulating resin, and preferably, colorless and transparent, has a bottom face part 31, and the first and second side wall parts 35, 37. The bottom face part 31 in a shape of a flat plate has an opening 32 in its center part. A leg part 33 is erected (projected downward) from an edge of the opening 32. Size of space inside of the opening 32 and the leg part 33 is equal to or a slightly larger than a size of a projected part 192 of the pin block 19 so that the projected part 192 of the pin block 19 can be guided without a backlash. As shown in FIG. 1A, a lower end of the leg part 33 is inwardly folded to form a folded part 331, and an opening 332 at a lower end of the leg part 33 has a size corresponding to the connector 2. As shown in FIG. 1B, the lower end opening 332 includes a taper part 333 having an opening which is gradually reduced from a distal end, by a determined length, and a butting part 334 having a constant opening extending upward from the taper part 333. The taper part 333 facilitates positioning of the leg part 33 (positioning of the guide 30) with respect to the connector 2. On occasion of conducting the inspection, an inner side face of the butting part 334 is butted against side faces of the connector 2.

The first and second side wall parts 35, 37 are erected from the bottom face part 31 to an opposite side to the leg part 33 (upward), at both sides of the position where the leg part 33 is erected, so as to be opposed to each other in parallel. Both ends of a rod member 38 formed of metal such as aluminum, for example, are respectively inserted into stepped through holes 352, 372 in the first and second side wall parts 35, 37, so as to bridge the first and second side wall parts 35, 37. The other end of the spring 90 is attached to (hooked on) the rod member 38.

As shown in FIG. 2, the bottom face part 31 and the leg part 33 are integrally formed, while the bottom face part 31 and the first and second side wall parts 35, 37 are separate bodies. The bottom face part 31, and the first and second side wall parts 35, 37 are fixed together with screws 313, 314, in a state where convex parts 351, 371 at respective center parts of lower ends of the first and second side wall parts 35, 37 are engaged with concave parts 311, 312 at both side edges of the bottom part 31. Moreover, female thread holes are formed at both ends of the rod member 38, and screws 381, 382 are screwed into the female thread holes thereby to fix the rod member 38 to the first and second side wall parts 35, 37. The first and second side wall parts 35, 37 preferably have the same shape from a viewpoint of productivity.

Coupling between the probe holding body 10 and the guide 30 will be described. The bosses 35a, 35b which constitute the coupling unit in combination with the aforesaid guide grooves 11a, 11b are fitted into holes 353, 354 in the first side wall part 35. In the same manner, the bosses 37a, 37b which constitute the coupling unit are fitted into holes 373, 374 in the second side wall part 37. The bosses 35a, 35b are projected from the first side wall part 35, and the projected portions are engaged with the guide grooves 11a, 11b on the right side face of the sliding member 11 of the probe holding body 10 so as to relatively slide along the guide grooves 11a, 11b. In the same manner, the bosses 37a, 37b are engaged with the guide grooves (not shown) on the left side face of the sliding member 11 so as to relatively slide along the relevant guide grooves. Accordingly, the probe holding body 10 and the guide 30 can relatively slide with respect to each other. A slidable range is determined (restricted) by a shape of the guide grooves.

As shown in FIG. 1A, the guide grooves 11a, 11b have first guide groove parts 121a, 121b for linearly guiding the bosses 35a, 35b in parallel with and in a longitudinal direction of the probes 17, and second guide groove parts 122a, 122b which are extended at a determined angle from lower ends of the first guide groove parts 121a, 121b for guiding the bosses 35a, 35b diagonally downward. Connection points between the first guide groove parts 121a, 121b and the second guide groove parts 122a, 122b are R-shaped so as not to be angulated.

Figure 4:
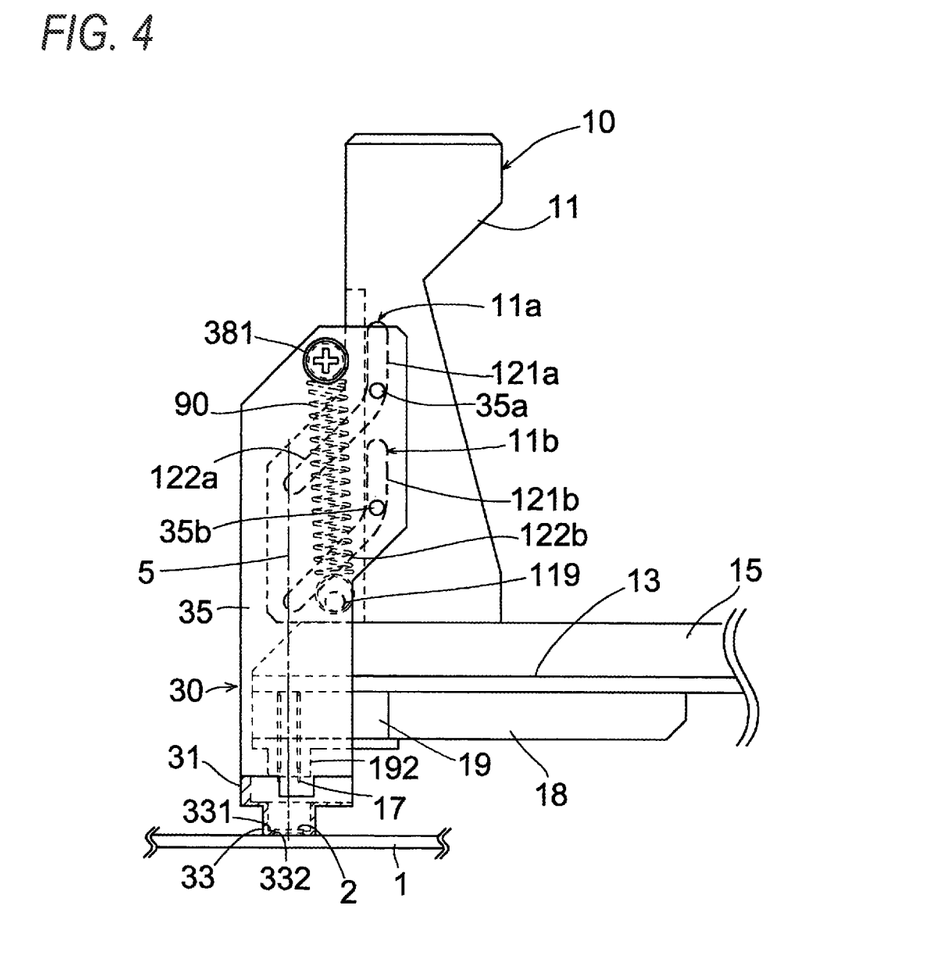
FIG. 4 is a side view of the inspecting jig in the first embodiment, when probes are directly above the connector.
Figure 5:
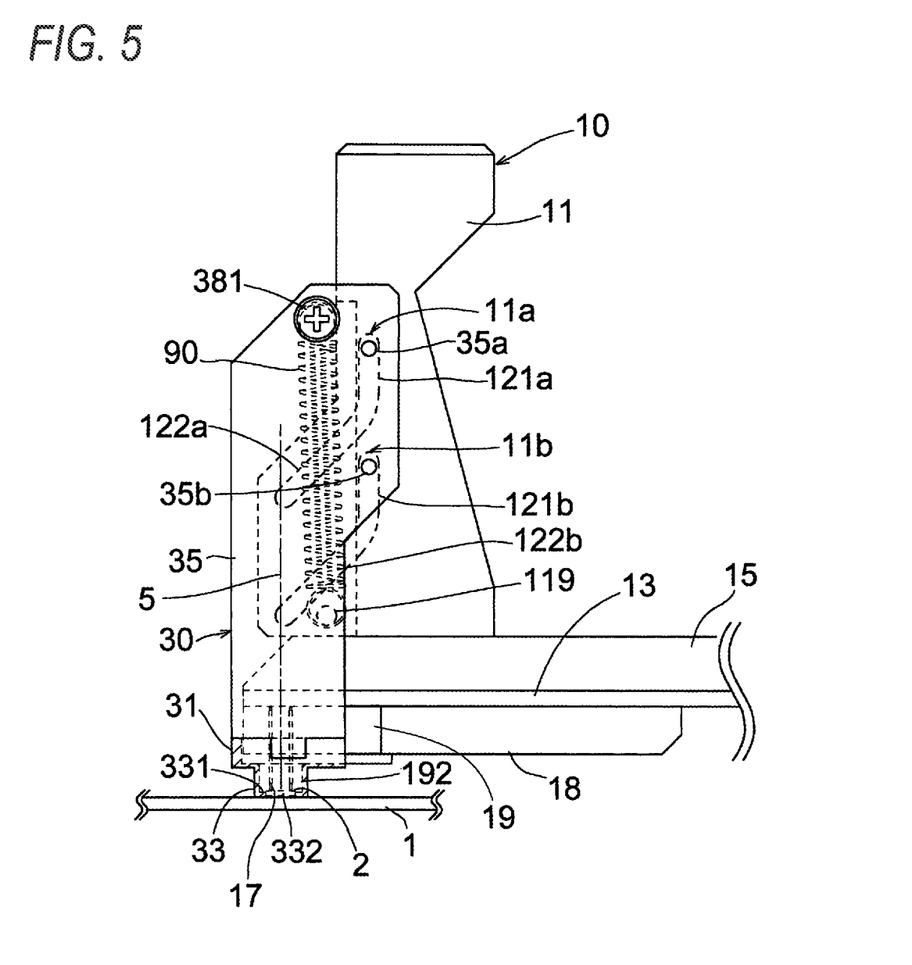
FIG. 5 is a side view of the inspecting jig in the first embodiment, when distal ends of the probes are brought into contact with the connector.

The probe holding body 10 is pulled with respect to the guide 30, by the spring 90 which interconnects the rod members 38 and 119, and the guide 30 is urged to a relative position as shown in FIG. 1A (and in FIG. 3A) (corresponding to the second relative position). On occasion of conducting the inspection, an inspector presses down the probe holding body 10 against an urging force of the spring 90, thereby to move the probe holding body 10 and the guide 30 from the relative position as shown in FIG. 1 (and in FIG. 3) to a relative position as shown in FIG. 4 (corresponding to the third relative position) and a relative position as shown in FIG. 5 (corresponding to the first relative position).

Now, a flow of the inspection using the inspecting jig in this embodiment will be described.

1. Positioning Step

Figure 3A:
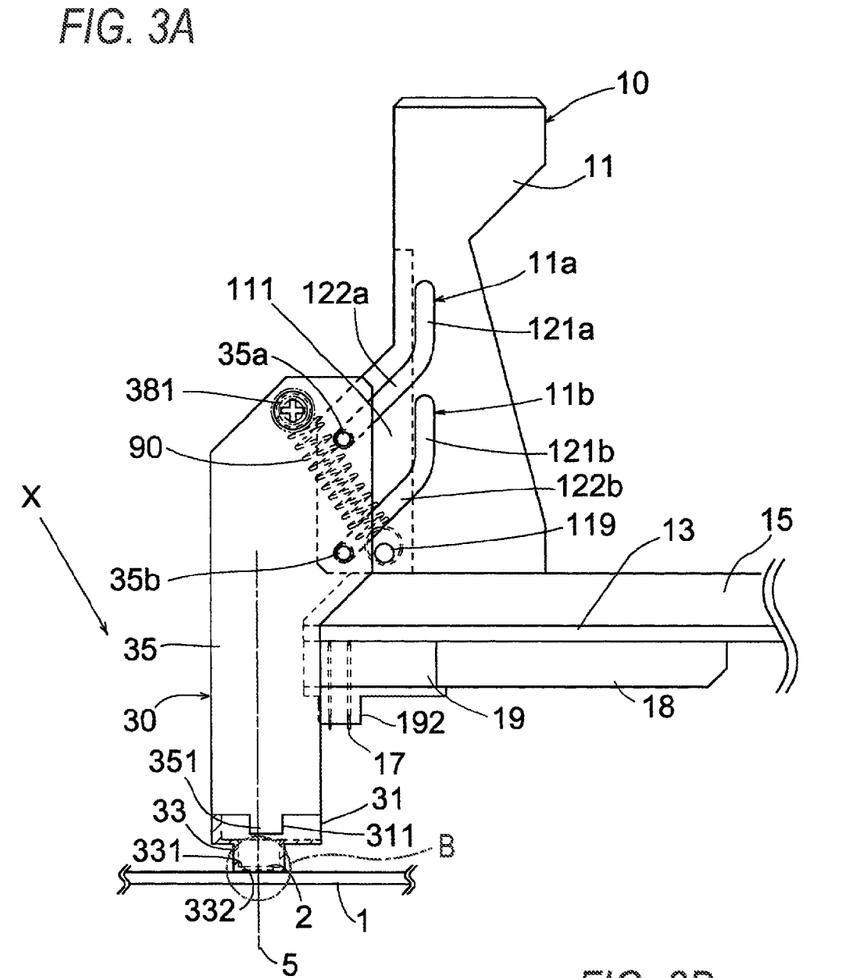
FIG. 3A is a side view of the inspecting jig in the first embodiment, when a guide is positioned with respect to a connector on a board.
Figure 3B:
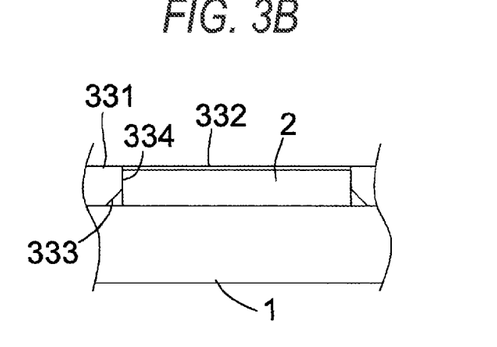
FIG. 3B is a partial enlarged view of a portion indicated by B shown in FIG. 3B.

The inspector sets the inspecting jig, as shown in FIG. 3A. Specifically, the leg part 33 of the guide 30 is engaged with the connector 2 on the board 1. More specifically, the lower end of the leg part 33 is butted against the board 1 so that the connector 2 may be inserted into the lower end opening 332 of the leg part 33. As shown in FIG. 3B, the inner face of the butting part 334 of the lower end opening 332 is butted against the side faces of the connector 2.

On this occasion, urged by the spring 90, the probe holding body 10 and the guide 30 are maintained in the second relative position. In this second relative position, the distal ends of the probes 17 are separated from the board 1, the probes 17 are in parallel with an imaginary line 5, which is perpendicular to the board 1 and passes the connector 2, and the distal ends of the probes 17 are separated from the imaginary line 5. Moreover, the probe holding body 10 and the wiring board 13 are also separated from the imaginary line 5. Further, the guide 30 has nothing which is erected upward from the bottom face part 31, except the first and second side wall parts 35, 37. Therefore, eyes of the inspector (shown by an arrow mark X in FIG. 3) can visually recognize the connector 2 through the opening 32 of the bottom face part 31, while the positioning step is carried out, and hence, good positioning workability can be obtained.

2. Probe Contacting Step

The inspector presses down the probe holding body 10 against the urging force of the spring 90, thereby to relatively move the probe holding body 10 and the guide 30 from the second relative position as shown in FIG. 3A to the third relative position as shown in FIG. 4. Specifically, the bosses 35a, 35b are relatively moved along the guide groove parts 122a, 122b (The bosses 37a, 37b are also relatively moved, at the same time and in the same manner). In this third relative position, the distal ends of the probes 17 are separated from the board 1, and the probes 17 are in parallel with the imaginary line 5 and positioned directly above the connector 2. The connector 2 is positioned on an imaginary extending line of the probes 17. Moreover, the distal ends of the probes 17 come near the board 1, as compared with the second relative position. During the relative movement from the second relative position to the third relative position, a distance between the distal ends of the probes 17 and the board 1 is flatly decreased. Specifically, the probes 17 linearly move diagonally downward in a process of the relative movement from the second relative position to the third relative position, and hence, the distance between the distal ends of the probes 17 and the board 1 is not increased, but decreased.

The inspector further presses down the probe holding body 10 resisting the urging force of the spring 90 thereby to relatively move the probe holding body 10 and the guide 30 linearly from the third relative position as shown in FIG. 4 to the first relative position as shown in FIG. 5. Specifically, the bosses 35a, 35b are relatively moved linearly along the guide groove parts 121a, 121b (The bosses 37a, 37b are also relatively moved, at the same time and in the same manner). A direction of the relative movement, on this occasion, is in parallel with the imaginary line 5 and the probes 17.

In this first relative position, the projected part 192 of the pin block 19 is inserted into the leg part 33 of the guide 30 (guided by the leg part 33), the probes 17 are in parallel with the imaginary line 5, and the distal ends of the probes 17 are brought into contact with the connector 2. Then, an object to be inspected such as an electronic component having the connector 2 is inspected. Specifically, the probes 17 receive a signal from the connector 2, and transmit the signal to an inspecting apparatus, which is not shown, by way of the wiring board 13. Alternatively, the signal sent from the inspecting apparatus, which is not shown, is transmitted from the probes 17 to the connector 2, by way of the wiring board 13. It is to be noted that the relative movement from the second relative position as shown in FIG. 3A to the first relative position as shown in FIG. 5 is continuously performed without once stopping in the third relative position as shown in FIG. 4. When the inspecting jig is separated from the board 1, after the inspection has been finished, the probe holding body 10 and the guide 30 are returned to the second relative position as shown in FIG. 1A, by the urging force of the spring 90.

According to this embodiment, the following advantages can be obtained.

(1) Because the probe holding body 10 and the guide 30 are coupled as described above, it is possible to maintain the probes 17, the probe holding body 10, and the wiring board 13 in a state separated from the imaginary line 5 which is perpendicular to the board 1 and passes the connector 2 (in other words, directly above the connector 2), while the positioning step is carried out (the second relative position as shown in FIGS. 1A and 3A). Moreover, the side wall part is not present in front and in rear of the opening 32 of the bottom face part 31. Therefore, the inspector can visually observe the connector 2 through the opening 32 from diagonally above at the front side. As the results, workability in the positioning step is enhanced, and there occur less errors, as compared with the structure in which the connector and its surroundings are covered with the guide plate, the probes, and the holding body, on occasion of positioning, as in JP-A-2005-283218.

(2) Because of the urging force of the spring 90, the inspector can unconsciously maintain the probe holding body 10 and the guide 30 in the second relative position as shown in FIGS. 1A and 3A, during the positioning step. Accordingly, favorable visual observation of the connector 2 in the positioning step can be easily secured. Moreover, after the inspection has been finished, the probe holding body 10 and the guide 30 are automatically returned by the urging force of the spring 90 from the first relative position as shown in FIG. 5 to the second relative position as shown in FIGS. 1A and 3A, and therefore, smooth transition to the next inspection can be attained.

(3) The movement from the third relative position as shown in FIG. 4 to the first relative position as shown in FIG. 5 is linearly made in parallel with the imaginary line 5 and the probes 17. Therefore, the probes 17 can be perpendicularly butted against the connector 2, and stress in the lateral direction (the direction perpendicular to the probes 17) is not generated. As the results, it is possible to prevent breakdown of the probes 17, and butting reliability is enhanced.

(4) Because the bottom face part 31 is colorless and transparent, the connector 2 can be visually observed not only through the opening 32, but also through the bottom face part 31. As the results, the positioning workability is further enhanced.

(5) Because the probes 17 are butted against the connector 2 without interposing the board 1, it is possible to conduct the inspection without any inconvenience, different from the structure in JP-A-2008-140770, even though the connector 2 is in the center part of the board 1.

(6) Because only the lower end of the leg part 33 is the butting part to be butted against the board 1, it is possible to conduct the inspection without any trouble, even though other components are present around the connector 2 on the board 1.

(7) Because the guide grooves 11a, 11b have the shape as described above, the distance between the distal ends of the probes 17 and the board 1 is flatly decreased in the process of the relative movement from the second relative position as shown in FIG. 3A to the third relative position as shown in FIG. 4 (In short, not increased but decreased). Specifically, in case of the relative movement from the second relative position as shown in FIG. 3A to the first relative position as shown in FIG. 5, via the third relative position as shown in FIG. 4, the inspector need not apply a force in an upward direction to the probe holding body 10. Therefore, the smooth relative movement from the second relative position as shown in FIG. 3A to the first relative position as shown in FIG. 5 can be easily made, without once stopping in the third relative position as shown in FIG. 4, and the workability is enhanced.

Second Embodiment

Figure 6:
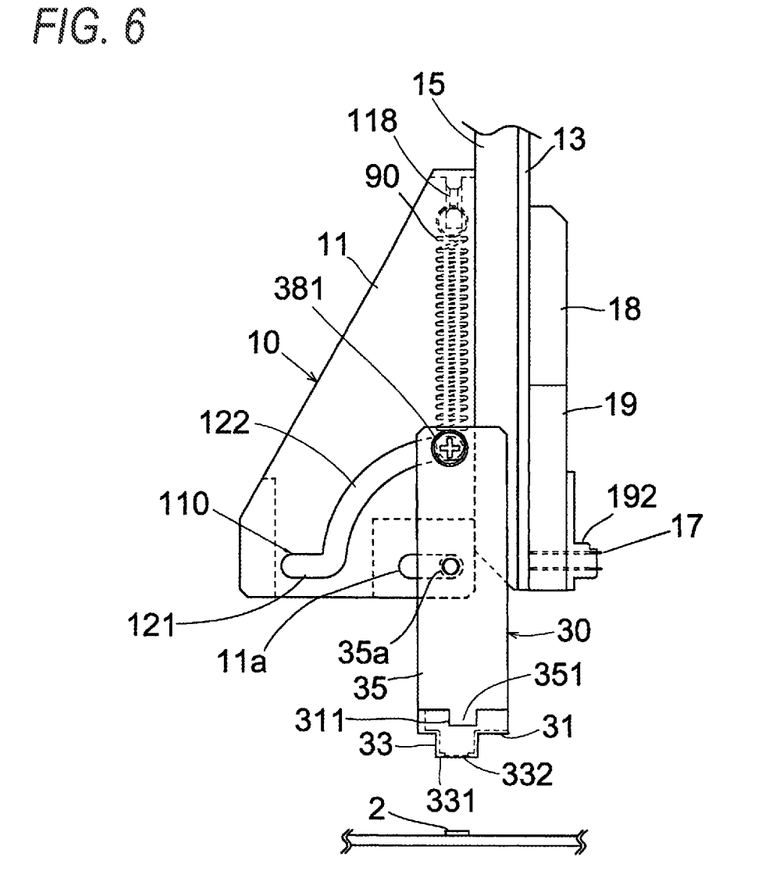
FIG. 6 is a side view of an inspecting jig in a second embodiment according to the invention.
Figure 7:
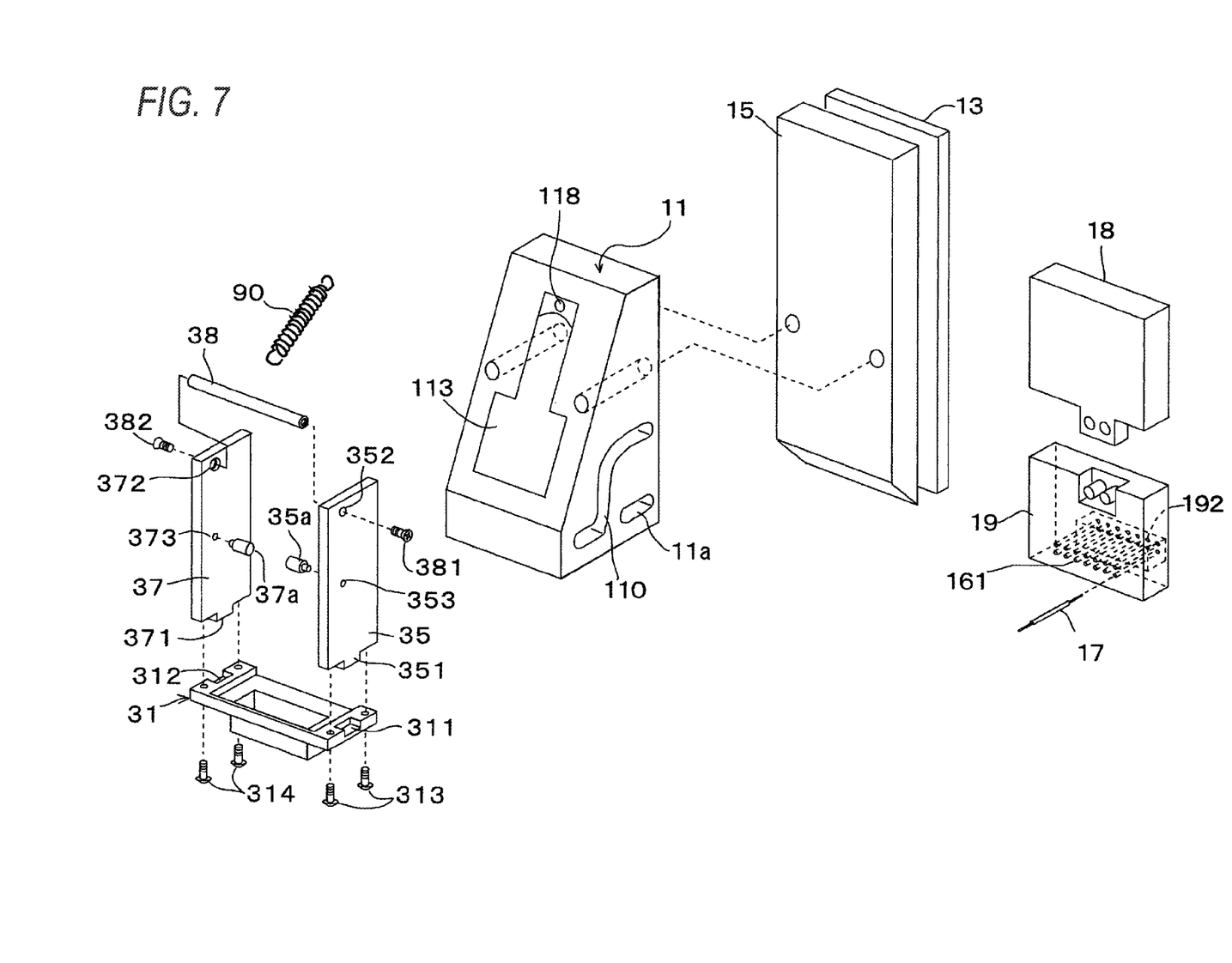
FIG. 7 is an exploded perspective view of the inspecting jig in the second embodiment.

FIG. 6 is a side view of an inspecting jig according a second embodiment of the invention. FIG. 7 is an exploded perspective view of the inspecting jig. Although the probes 17 are moved in parallel between the respective relative positions in the first embodiment, the probes 17 are rotated in addition to the parallel movement, in this embodiment. The second embodiment will be described below, mainly referring to different points from the first embodiment.

A guide slit 110 which is formed on a right side face of a sliding member 11 (herein, having a laterally symmetrical shape) includes a first guide slit part 121 having a linear shape in parallel with the probes 17, and a second guide slit part 122 having a curved shape such as an arc-shape. A left side face of the sliding member 11 is also formed with a guide slit (not shown) having the same shape, and both the guide slits are bridged by a rod member 38. Both ends of the rod member 38 passing through both the guide slits are respectively inserted into stepped through holes 352, 372 of first and second side wall parts 35, 37, and screws 381, 382 are screwed into female thread holes in the both ends thereby to fix the rod member 38 to the first and second side wall parts 35, 37.

A boss 35a is fitted into a hole 353 in the first side wall part 35. A boss 37a is fitted into a hole 373 in the second side wall part 37. A portion of the boss 35a projected from the first side wall part 35 is engaged with a guide groove 11a (having a linear shape in parallel with the probes 17) on the right side face of the sliding member 11 of the probe holding body 10, and the boss 35a can relatively slide along the guide groove 11a. The boss 37a is engaged with a guide groove (not shown, having the same shape as the guide groove 11a) on the left side face of the sliding member 11, and can relatively slide along the relevant guide groove.

One end of a spring 90 is attached to (hooked on) a hooking part 118 of the sliding member 11, and the other end is attached to (hooked on) the rod member 38. The spring 90 urges the probe holding body 10 and the guide 30 to a relative position as shown in FIG. 6 (and in FIG. 8) (corresponding to the second relative position). On occasion of conducting an inspection, an inspector rotates and presses down the probe holding body 10 resisting an urging force of the spring 90, thereby to relatively move the probe holding body 10 and the guide 30 from the relative position as shown in FIG. 6 (and in FIG. 8) to a relative position as shown in FIG. 9 (corresponding to the third relative position) and a relative position as shown in FIG. 10 (corresponding to the first relative position).

A flow of the inspection using the inspecting jig in this embodiment will be described below.

Figure 8:
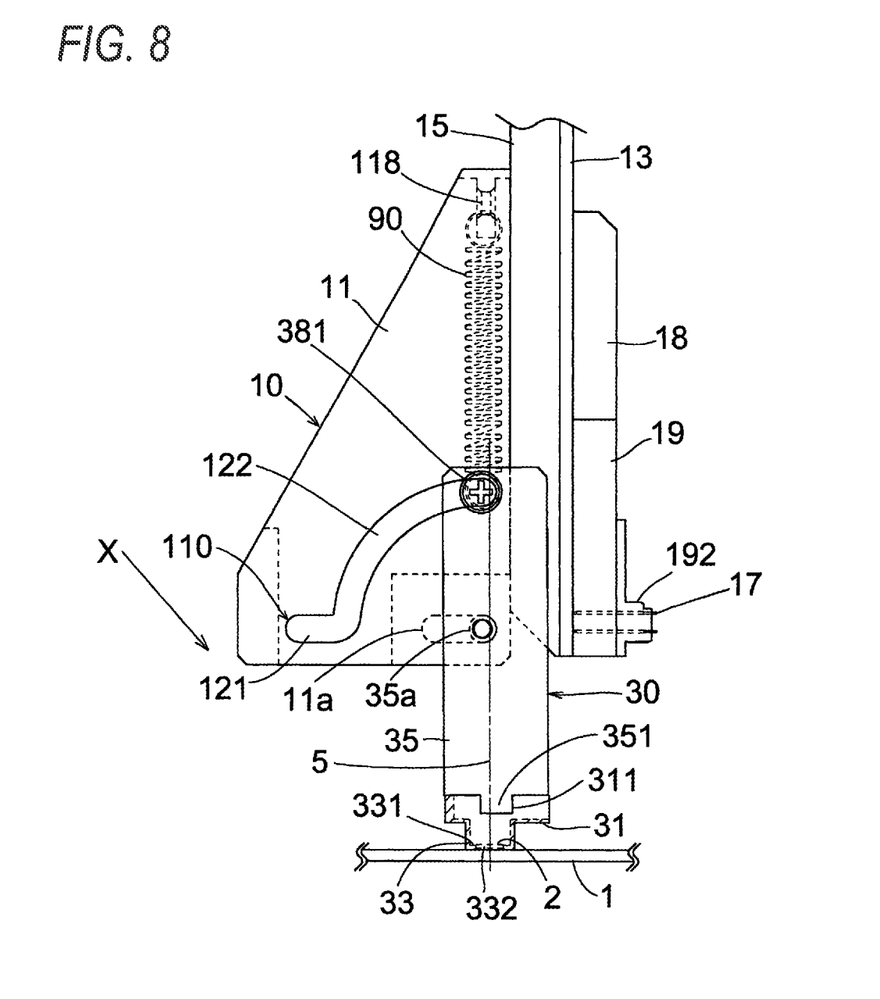
FIG. 8 is a side view of the inspecting jig in the second embodiment, when a guide is positioned with respect to a connector on a board.

The inspector sets the inspecting jig, as shown in FIG. 8. Specifically, the leg part 33 of the guide 30 is engaged with the connector 2 on the board 1. On this occasion, the probe holding body 10 and the guide 30 are in the second relative position under the urging force of the spring 90. In this second relative position, the distal ends of the probes 17 are separated from the board 1, the probes 17 are perpendicular to an imaginary line 5, which is perpendicular to the board 1 and passes the connector 2, and the distal ends of the probes 17 are separated from the imaginary line 5. The probe holding body 10 and the wiring board 13 are also separated from the imaginary line 5. Further, the guide 3C has nothing which is erected upward from the bottom face part 31, except the first and second side wall parts 35, 37. Therefore, eyes of the inspector (shown by an arrow mark X in FIG. 8) can visually observe the connector 2 through the opening 32 in the bottom face part 31, and thus, good positioning workability can be attained. It is also possible to see the connector 2 through the space 113 in the sliding member 11 and through the opening 32 in the bottom face part 31.

Figure 9:
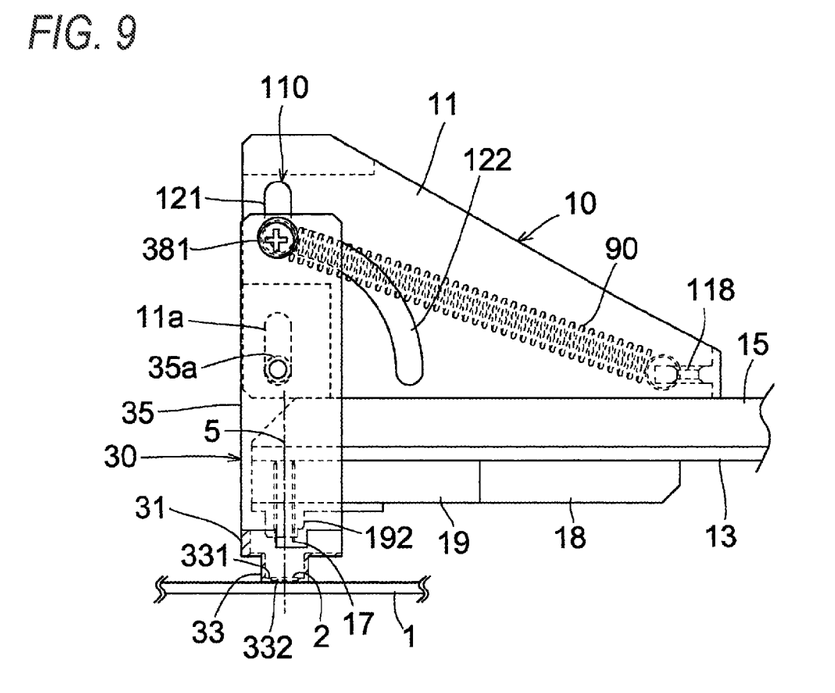
FIG. 9 is a side view of the inspecting jig in the second embodiment, when probes are directly above the connector.
Figure 10:
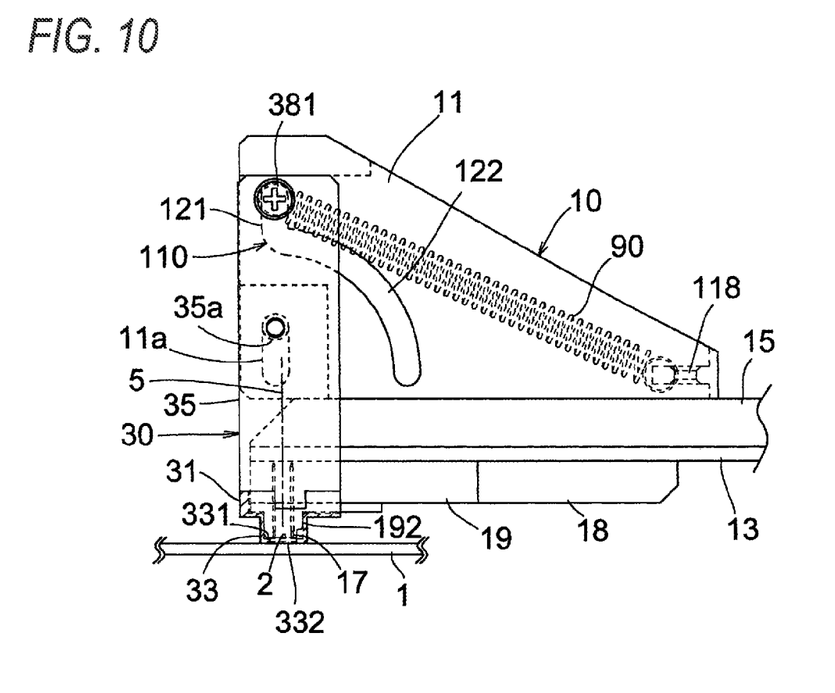
FIG. 10 is a side view of the inspecting jig in the second embodiment, when distal ends of the probes are brought into contact with the connector.

The inspector rotates the probe holding body 10 around the bosses 35a, 37a with respect to the guide 30, resisting the urging force of the spring 90, thereby to relatively move the probe holding body 10 and the guide 30 from the second relative position as shown in FIG. 8 to the third relative position as shown in FIG. 9. Specifically, the rod member 38 is relatively moved along the second guide slit part 122. In this third relative position, the distal ends of the probes 17 are separated from the board 1, and the probes 17 are directly above the connector 2 in parallel with the imaginary line 5, and the connector 2 is positioned on an imaginary extending line of the probes 17. Moreover, the distal ends of the probes 17 come near the board 1, as compared with the second relative position.

The inspector presses down the probe holding body 10 against the urging force of the spring 90 thereby to relatively move the probe holding body 10 and the guide 30 linearly from the third relative position as shown in FIG. 9 to a first relative position as shown in FIG. 10. Specifically, the rod member 38 relatively moves linearly along the first guide slit part 121. At the same time, the boss 35a relatively moves linearly along the guide groove 11a (The boss 37a too relatively moves at the same time and in the same manner). A direction of the relative movement on this occasion is in parallel with the imaginary line 5 and the probes 17.

In this first relative position, the projected part 192 of the pin block 19 is inserted into the leg part 33 of the guide 30 (guided by the leg part 33), the probes 17 are in parallel with the imaginary line 5, and the distal ends of the probes 17 are brought into contact with the connector 2. Then, the inspection is carried out on the object to be inspected having the connector 2. When the inspecting jig is separated from the board 1, after the inspection has been finished, the probe holding body 10 and the guide 30 are returned to the second relative position as shown in FIG. 6 by the urging force of the spring 90.

According to this second embodiment, operability is rather complicated, but in other points, substantially the same advantages as in the first embodiment can be achieved.

Although the invention has been heretofore described referring to the embodiments by way of example, it is to be understood by those skilled in the art that various modifications can be added to the constituent elements and processes in the embodiments. Now, the modifications will be described.

The guide groove 11a and the like in the embodiments may be a guide slit. In this case, for preventing the bosses from being disengaged, such devices as forming the guide slit as a stepped slit had better be adopted. Alternatively, a rod member interconnecting the right and left guide slits may be provided instead of the bosses.

On the contrary to the embodiments, the guide groove 11a and the like may be provided on the guide 30 (the first and second side wall parts 35, 37), and the boss 35a may be provided on the probe holding body 10 (the sliding member 11). In this case too, substantially the same relative movements can be realized.

It is considered that the spring 90 is not provided in view of cost or other reasons, although the operability is deteriorated.

The leg part 33 is not necessarily in a shape shown in FIG. 2 and FIG. 7. It is also possible to erect separate leg parts (for example, four), which guide the side faces of the projected part 192 of the pin block 19 and come into contact with the side faces of the connector 2, from the bottom face part 31. The leg part 33 may be formed in a tubular shape, and an inner side face of the leg part 33 is butted against a side face of the connector 2.

According to an aspect of the invention, the coupling unit couples the probe holding body and the guide so as to relatively move between the first relative position and the second relative position, and therefore, by maintaining the second relative position, when the guide is positioned with respect to the connector, more favorable visual observation can be secured, as compared with the jig in JP-A-2005-283218. In addition, different from the relay connector in JP-A-2008-140770, the board is not clamped in the structure according to the invention, and therefore, it is possible to bring the probe into contact with the connector, even in case where the connector is in a center part of the board.

What is claimed is:
1. An inspecting jig operable to bring a probe into contact with a connector on a board, the inspecting jig comprising:
   a probe holding body holding the probe;
   a guide guiding the probe to be brought into contact with the connector on the board, the guide being engaged with the connector thereby to be positioned with respect to the connector; and a coupling unit coupling the probe holding body and the guide so as to relatively slide with respect to each other, between a first relative position and a second relative position, the first relative portion where a distal end of the probe is brought into contact with the connector when the guide is positioned with respect to the connector, the second relative position where the distal end of the probe is separated from the board and is separated from an imaginary line, which is perpendicular to the board and passes the connector, when the guide is positioned with respect to the connector, wherein the guide includes a bottom face part, a leg part which is erected from a peripheral edge of an opening in the bottom face part, and first and second side wall parts, which are erected from the bottom face part at both sides of a position where the leg part is erected, to an opposite side to the leg part, to be opposed to each other, the probe holding body is positioned between the first and second side wall parts, and includes first and second opposed faces to be opposed to the first and second side wall parts, the coupling unit includes a guide groove or a guide slit provided in one pair of the first and second opposed faces and the first and second side wall parts, and a boss or a rod member provided in the other pair of the first and second opposed faces and the first and second side wall parts, the boss or the rod member is engaged with the guide groove or the guide slit to relatively move along the guide groove or the guide slit, thereby enabling the probe holding body and the guide to relatively move between the first relative position and the second relative position, and in a state where the guide is positioned with respect to the connector, a side face of a distal end part of the leg part is butted against a side face of the connector, and a distal end of the leg part is butted against the board.

2. The inspecting jig according to claim 1, wherein the connector can be visually observed, when the probe holding body and the guide are at least in the second relative position.

3. The inspecting jig according to claim 1, wherein the coupling unit linearly couples the probe holding body and the guide so as to relatively move with respect to each other, between the first relative position and a third relative position where the distal end of the probe is separated from the board and the probe is in parallel with the imaginary line when the guide is positioned with respect to the connector.

4. The inspecting jig according to claim 1, wherein the guide includes a leg part which is erected toward the board, in such a manner that a side face of a lower end part of the leg part is butted against a side face of the connector, and a lower end of the leg part functions as a butting part to be butted against the board, in a state where the guide is positioned with respect to the connector.

5. The inspecting jig according to claim 1, wherein
the guide includes a bottom face part, and first and second side wall parts which are erected from both sides of the bottom face parts to an opposite side to the board and which are opposed to each other,
the first and second side wall parts are erected from right and left sides of the bottom face part, whereas a front side is open without a side wall part, and
the connector can be visually observed from the front side through an opening in the bottom face part, when the probe holding body and the guide are in the second relative position.

6. The inspecting jig according to claim 1 further comprising a spring provided between the probe holding body and the guide and urging the probe holding body and the guide to the second relative position.

7. The inspecting jig according to claim 1, wherein
the coupling unit includes a guide groove or a guide slit provided in one of the probe holding body and the guide, and a boss or a rod member provided in the other of the probe holding body and the guide, and
the boss or the rod member is engaged with the guide groove or the guide slit to relatively move along the guide groove or the guide slit, thereby enabling the probe holding body and the guide to relatively move between the first relative position and the second relative position.

8. The inspecting jig according to claim 1, wherein the leg part has a shape that enables the connector to be inserted into a lower end opening of the leg part, and an inner side face of the leg part is butted against the side face of the connector.

9. The inspecting jig according to claim 1, the guide is butted against the board only at the distal end of the leg part thereof.

* * * * *